United States Patent
Zumkehr et al.

(10) Patent No.: US 7,095,245 B2
(45) Date of Patent: Aug. 22, 2006

(54) INTERNAL VOLTAGE REFERENCE FOR MEMORY INTERFACE

(75) Inventors: John F. Zumkehr, Orange, CA (US); James E. Chandler, Mission Viejo, CA (US); Ray I. Chiang, Irvine, CA (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 10/714,075

(22) Filed: Nov. 14, 2003

(65) Prior Publication Data

US 2005/0104624 A1   May 19, 2005

(51) Int. Cl.
*H03K 19/00* (2006.01)

(52) U.S. Cl. .......................... 326/16; 326/86
(58) Field of Classification Search ............... 326/16, 326/30, 86; 327/112, 543; 702/107
See application file for complete search history.

(56) References Cited

U.S. PATENT DOCUMENTS

| | | | |
|---|---|---|---|
| 6,137,720 A | 10/2000 | Lancaster | |
| 6,246,258 B1 * | 6/2001 | Lesea | 326/39 |
| 6,262,617 B1 | 7/2001 | McClure | |
| 6,316,980 B1 | 11/2001 | Vogt et al. | |
| 6,445,245 B1 * | 9/2002 | Schultz et al. | 327/541 |
| 6,456,544 B1 | 9/2002 | Zumkehr | |
| 6,581,017 B1 | 6/2003 | Zumkehr | |
| 6,617,895 B1 | 9/2003 | Zumkehr et al. | |
| 6,629,225 B1 | 9/2003 | Zumkehr | |
| 6,636,821 B1 * | 10/2003 | Lawson | 702/107 |
| 6,864,731 B1 | 3/2005 | Zumkehr et al. | |
| 6,918,048 B1 | 7/2005 | Zumkehr | |
| 6,922,077 B1 | 7/2005 | Chandler et al. | |
| 2002/0050850 A1 | 5/2002 | Nakamura | |
| 2003/0235084 A1 | 12/2003 | Zumkehr et al. | |
| 2004/0123207 A1 | 6/2004 | Zumkehr et al. | |

FOREIGN PATENT DOCUMENTS

EP    1 031 990 A2    8/2000

OTHER PUBLICATIONS

JEDEC STANDARD, DDRM SDRAM Specification, JESD79-2, Sep. 2003, JEDEC Solid State Technology Association, Electronic Industries Alliance.
JEDEC STANDARD, Double Data Rate (DDR) SDRAM Specification, JESD79C (Revision of JESD79B), Mar. 2003, JEDEC Solid State State Technology Association, Electronic Industries Alliance

* cited by examiner

*Primary Examiner*—Daniel Chang
(74) *Attorney, Agent, or Firm*—Blakely, Sokoloff, Taylor & Zafman LLP

(57) ABSTRACT

Embodiments of the invention include a memory controller to interface to memory. In one embodiment, the memory controller includes a pull-up calibration terminal to couple to an external pull-up resistor, a pull-down calibration terminal to couple to an external pull-down resistor, a voltage reference node, a first switch coupled between the pull-up calibration terminal and the voltage reference node, and a second switch coupled between the pull-down calibration terminal and the voltage reference node. The first switch and the second switch may be selectively closed to generate an internal voltage reference on the voltage reference node in a normal mode that may be used for comparison with an input signal to receive data.

38 Claims, 5 Drawing Sheets

INTERNAL VOLTAGE REFERENCE FOR MEMORY INTERFACE

BACKGROUND OF THE INVENTION

1. Field of the Invention

Embodiments of the invention relate generally to voltage reference generation, and specifically to internal voltage reference generation for a DDR memory interface.

2. Background Information

Packaging costs are a significant part of the cost of semiconductor devices. Typically the greater number of pins or terminals in a package the greater is the costs of the package. Moreover, pins or terminals of a package require space in order to make a connection such as to a printed circuit board. If the requirements for a pin or terminal can be eliminated in an interface, the package costs may be reduced or otherwise the unused pin can be assigned to a different function, such as an extra pin or terminal for power or ground.

Voltage references with known voltage levels may be used for comparison with unknown levels of input signals to make some determination about the unknown levels. The voltage references used for such comparisons may be generated in a number of ways. A voltage reference may be generated externally and coupled into an integrated circuit (IC) through a dedicated voltage reference pin or terminal of a package for use by circuits therein. In this case, the semiconductor die of the IC has a dedicated voltage reference pad to couple to the voltage reference pin or terminal of the package.

The use of a dedicated voltage reference pin or terminal of a package increases the package costs. Additionally, the use of the dedicated voltage reference pin or terminal also increases the costs of the semiconductor die of the IC by accommodating the dedicated pad for the external voltage reference.

DETAILED DESCRIPTION

Figure 1:
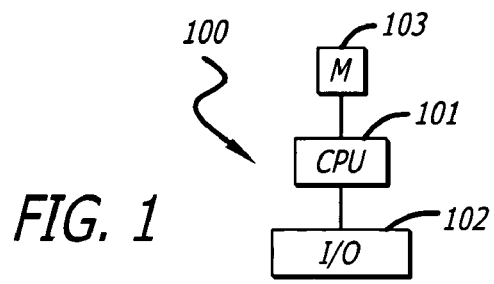
FIG. 1 illustrates a block diagram of a typical computer system in which embodiments of the invention may be utilized.

In the following detailed description of embodiments of the invention, numerous specific details are set forth in order to provide a thorough understanding of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

Embodiments of the invention eliminate an external voltage reference (VREF), the external voltage reference (VREF) pin/terminal from the package, and an external voltage reference pad on the semiconductor die by generating an internal voltage reference VREF from other pins/terminals typically used to perform Off Chip Driver (OCD) calibration. A pair of calibration pins/terminals (OCDH and OCDL) are used to provide a voltage or impedance to calibrate output drivers driving memory devices that support a double data rate (DDR) II specification, described in a JEDEC Standard JESD79-2 "DDR2 SDRAM SPECIFICATION", September 2003 by the JEDEC Solid State Technology Association. In a memory controller, one calibration terminal/pin is a reference for OCD pull-up calibration while the other calibration terminal/pin is a reference for the OCD pull-down calibration. These calibration terminals/pins are used during initialization or periodic calibration when the memories are not available. During OCD calibration, the internally generated voltage reference (VREF) is not used by the input receivers of the memory controller to receive data.

When OCD calibration is done, the internal voltage reference VREF may be generated and used at the digital input receivers to receive data. In this case, the internal voltage reference VREF is used to compare against an incoming digital data signal to make a determination as to whether or not the input signal is a logic level zero or a logic level one. That is, the voltage level of the internal voltage reference VREF acts as a trip point or switch point. An input signal with a voltage level above the trip point is a logic level one and an input signal with a voltage level below the trip point is a logic level zero, for example.

In one embodiment of the invention, an integrated circuit to interface to memory is disclosed. The integrated circuit includes a first off chip driver calibration terminal to couple to an external pull-up resistor; a second off chip driver calibration terminal to couple to an external pull-down resistor; a first switch coupled between the first off chip driver calibration terminal and a voltage reference node; and a second switch coupled between the second off chip driver calibration terminal and the voltage reference node. The first switch and the second switch are selectively closed to generate an internal voltage reference on the voltage reference node with which an input signal may be compared in order to receive data; the first switch is selectively closed and the second switch is selectively opened to generate a pull-up calibration voltage on the voltage reference node to calibrate an off-chip driver; and the first switch is selectively opened and the second switch is selectively closed to generate a pull-down calibration voltage on the voltage reference node to further calibrate the off-chip driver.

In another embodiment of the invention, a method in an integrated circuit for interfacing to a memory is disclosed including if in an off-chip driver calibration mode for a pull-up, then selecting a pull-up calibration terminal to be coupled to a voltage reference node to provide a pull-up calibration voltage thereon, and calibrating a pull-up of an off chip driver; and if in an off-chip driver calibration mode for a pull-down, then selecting a pull-down calibration terminal to be coupled to the voltage reference node to provide a pull-down calibration voltage thereon, and calibrating the pull-down of an off chip driver; and if in a normal mode to receive data, then selecting the pull-up calibration terminal and the pull-down calibration terminal to be coupled to the voltage reference node to provide a reference voltage thereon, and receiving data from a data input terminal.

In another embodiment of the invention, a system is disclosed including a processor for executing instructions and processing data; a double data rate memory device to store data from the processor and to read data to the processor; an external pull-up resistor having a first end coupled to a first power supply terminal; an external pull-down resistor having a first end coupled to a second power supply terminal; and a memory controller coupled between the double data rate memory device and the processor. The memory controller has a pull-up calibration terminal coupled to a second end of the external pull-up resistor, a pull-down calibration terminal coupled to a second end of the external pull-down resistor, a voltage reference node, a first switch having a first switch connection coupled to the pull-up calibration terminal and a second switch connection coupled to the voltage reference node, and a second switch having a first switch connection coupled to the pull-down calibration terminal and a second switch connection coupled to the voltage reference node.

In yet another embodiment of the invention, a processor for a computer system is disclosed including a memory controller to interface to memory. The memory controller has a pull-up calibration terminal to couple to an external pull-up resistor, a pull-down calibration terminal to couple to an external pull-down resistor, a voltage reference node, a first switch coupled between the pull-up calibration terminal and the voltage reference node, and a second switch coupled between the pull-down calibration terminal and the voltage reference node.

In yet another embodiment of the invention, a packaged integrated circuit to interface to memory is disclosed with a first off-chip driver calibration terminal to couple to a first external resistor; a second off-chip driver calibration terminal to couple to a second external resistor; a first plurality of field effect transistors having sources coupled in parallel together to the first off-chip driver calibration terminal and drains coupled in parallel together to a voltage reference node; and a second plurality of field effect transistors having drains coupled in parallel together to the second off-chip driver calibration terminal and sources coupled in parallel together to the voltage reference node.

Referring now to FIG. 1, a block diagram of a typical computer system 100 in which embodiments of the invention may be utilized is illustrated. The computer system 100 includes a central processing unit (CPU) 101; input/output devices (I/O) 102 such as keyboard, modem, printer, external storage devices and the like; and monitoring devices (M) 103, such as a CRT or graphics display. The monitoring devices (M) 103 provide computer information in a human intelligible format such as visual or audio formats. The system 100 may be a number of different electronic systems other than a computer system.

Figure 2A:
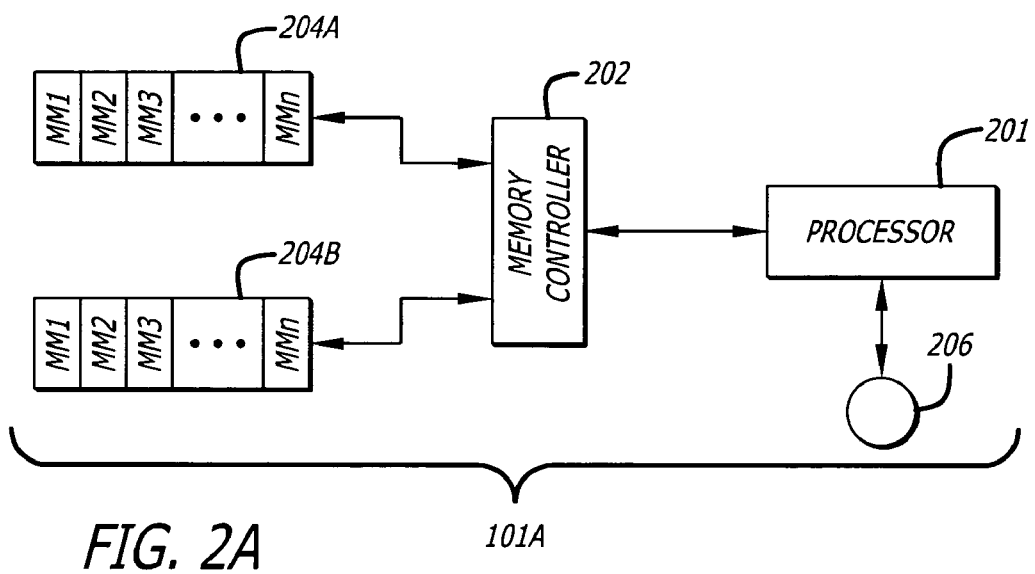
FIG. 2A illustrates a block diagram of a central processing unit in which embodiments of the invention may be utilized.

Referring now to FIG. 2A, a block diagram of a central processing unit 101A in which an embodiment of the invention may be utilized is illustrated. The central processing unit 101A includes a processor 201, a memory controller 202, and DDR memory 204A of a first memory channel coupled together as shown and illustrated. The central processing unit 101A may further include a second DDR memory 204B for a second memory channel, and a disk storage device 206.

Each of the DDR memories 204A and 204B may be one or more memory modules (MM1-MMn), such as a dual in-line memory module (DIMM) or a single in-line memory module (SIMM). As illustrated in FIG. 2C, the one or more memory modules 250 may include one or more DDR memory chips 252 coupled to a printed circuit board 251 with an edge connection 254, such as a SIMM or DIMM. The one or more DDR memory chips 252 of the one or more memory modules 250 of the DDR memories 204A,204B are typically dynamic random access memory (DRAM) but may be other types of storage with a similar type of memory interface. DDR memory uses a switch point or trip point to distinguish between a high logic level (i.e., a one logic level) and a low logic level (i.e., a zero logic level). The switch point or trip point is a single voltage level to distinguish between a one and a zero in contrast to a pair of voltage levels to distinguish between a one and a zero, such as used in standard TTL or CMOS logic for example. With a single level of the switch point or trip point, the waveform can swing over a narrower range of voltages and may transfer digital data (logical ones and zeroes) between devices at a faster data rate.

The memory controller 202 is a DDR memory controller to provide a DDR memory interface to the DDR memory 204A and 204B.

The disk storage device 206 may be a floppy disk, zip disk, DVD disk, hard disk, rewritable optical disk, flash memory or other non-volatile storage device.

Figure 2B:
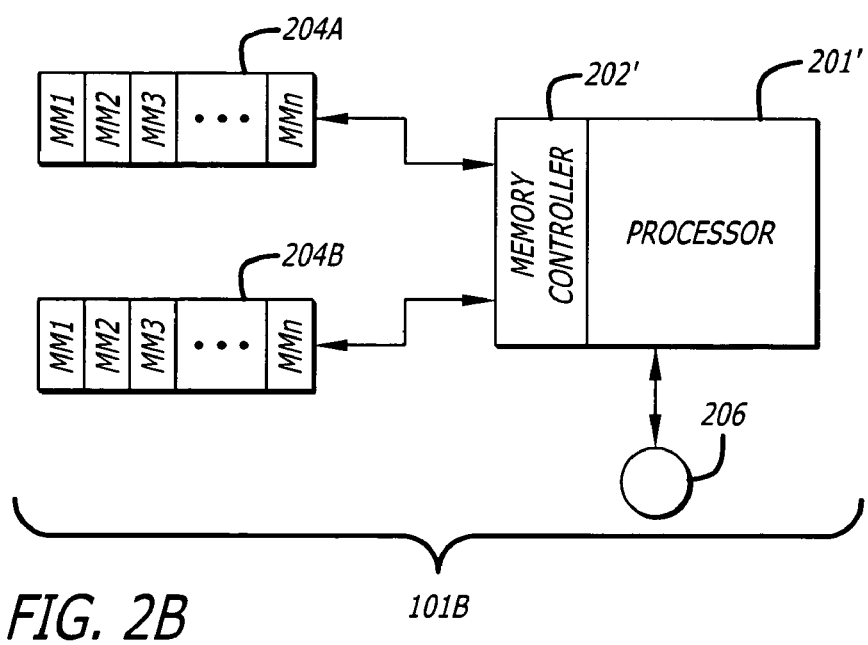
FIG. 2B illustrates a block diagram of another central processing unit in which embodiments of the invention may be utilized.
Figure 2C:
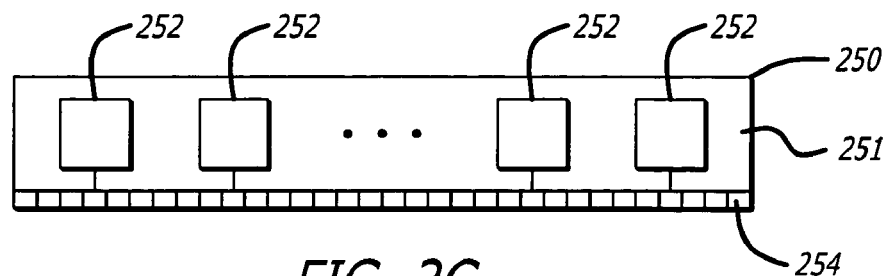
FIG. 2C illustrates a block diagram of a memory module including memory devices with output drivers that may be calibrated by a memory controller.

Referring now to FIG. 2B, a block diagram of a central processing unit 101B in which an embodiment of the invention may be utilized is illustrated. The central processing unit 101B includes a processor 201' with an internal memory controller 202' and DDR memory 204A of a first memory channel coupled together as shown and illustrated. The central processing unit 101B may further include a second DDR memory 204B for a second memory channel, and a disk storage device 206. In comparison with the central processing unit 101A, the processor 201' has an internal DDR memory controller 202' to provide a DDR memory interface to the DDR memory 204A and 204B.

The processor 201,201' may further include one or more execution units and one or more levels of cache memory. Other levels of cache memory may be external to the processor and interface to the memory controller. The processor, the one or more execution units, or the one or more levels of cache memory may read or write data (including instructions) through the memory controller with the DDR memory. In interfacing to the memory controller, there may be address, data, control and clocking signals coupled to the DDR memory as part of a DDR memory interface. The processors 201,201' and the disk storage device 206 may both read and write information into the DDR memories 204A,204B.

In order to increase the speed the data flow between the memory controller and the memories 204A,204B, the output drivers in the memory devices 252 may be initially calibrated when first installed and then periodically calibrated thereafter, such as at power-on for example. It is desirable to calibrate the driver in order to compensate for the slew rate and the impedance seen between the memory controller and the memory devices, as well as for temperature, process variations, and the wear over time. If not, the voltage may droop over long lines between devices, for example, and data transfer errors may occur.

The memory controller can perform calibration measurements and signal to the memory devices 252 to adjust the strength of their pull-up transistors and pull-down transistors of their output drivers. That is, the their impedance or resistance levels may be adjusted to get desired levels around the trip or switch point. In this case, the calibration of the output drivers in the memory devices is performed off-chip by the memory controller and is referred to as Off Chip Driver (OCD) calibration. Off Chip Driver (OCD) calibration includes OCD pull-up calibration of the pull up transistors in the output drivers of the memory devices and OCD pull-down calibration of the pull down transistors in the output drivers of the memory devices.

Figure 3:
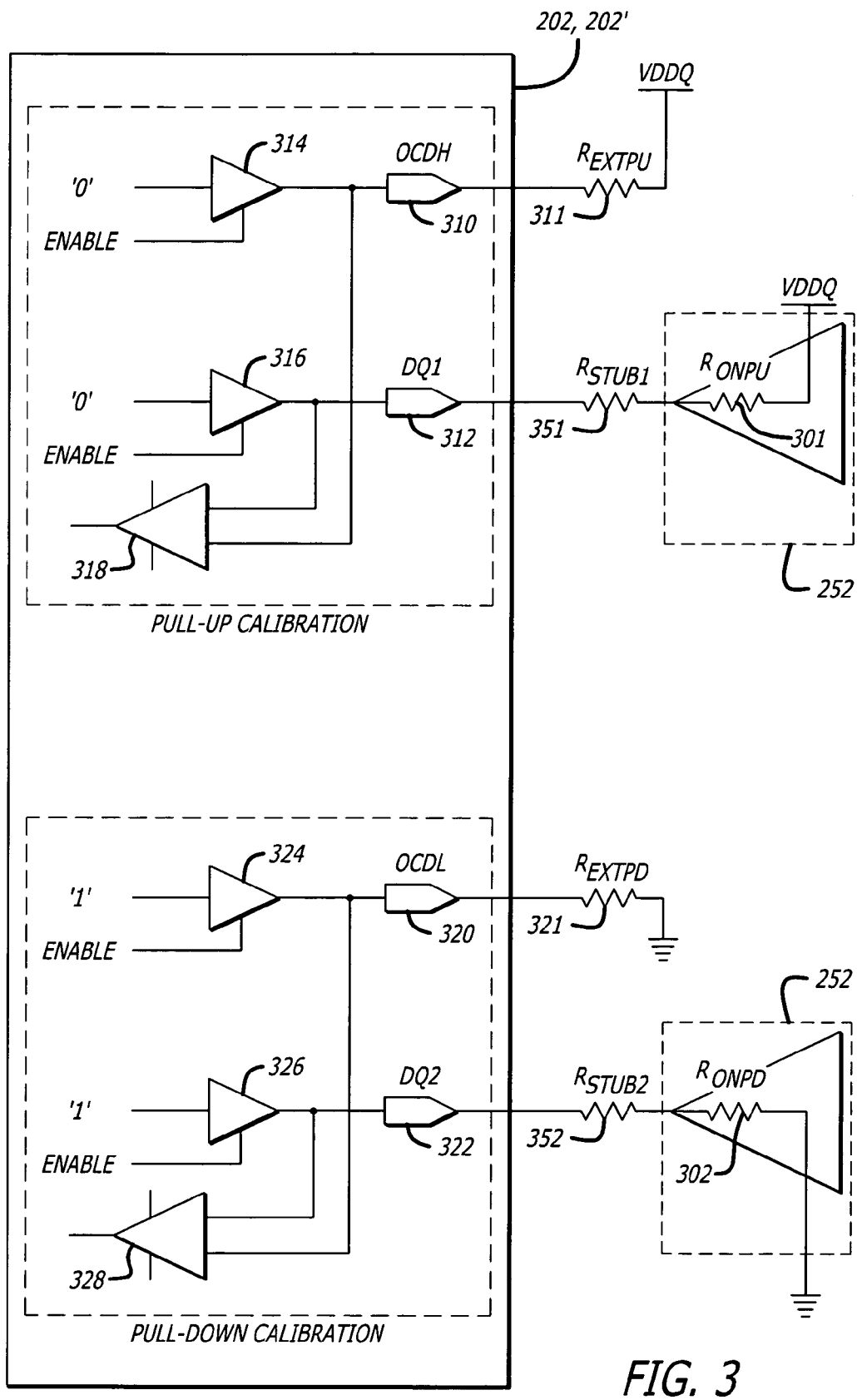
FIG. 3 illustrates a block diagram of elements to perform off chip driver (OCD) pull-up calibration and off chip driver (OCD) pull-down calibration in a memory controller.

Referring now to FIG. 3, a block diagram of the elements used to perform OCD pull-up calibration and OCD pull-down calibration by the memory controller 202,202' are illustrated. The OCD calibration is used to adjust the strength of the output drivers in the memory devices, such as the output drivers in the memory devices 252 of the memory modules in the memory 204A,204B. During calibration, data may be transmitted from the memory controller to the memory devices to adjust the drive settings of the output drivers from normal.

The elements for OCD pull-up calibration in the memory controller 202,202' are utilized to calibrate the on resistance of the pull-up transistors in the output drivers of the memory device 252, illustrated as the resistor $R_{ONPU}$ 301 in FIG. 3. The elements for OCD pull-down calibration in the memory controller 202,202' are utilized to calibrate the on resistance of the pull-down transistors in the output drivers of the memory device 252, illustrated as the resistor $R_{ONPD}$ 302 in FIG. 3.

The elements for OCD pull-up calibration by the memory controller 202,202' include the OCD high calibration pin OCDH 310 coupled to one end of an external pull-up resistor $R_{EXTPU}$ 311, an output of a tristate driver 314, and a first input of a comparator 318. The opposite end of the external pull-up resistor $R_{EXTPU}$ 311 is coupled to a first power supply terminal with a positive power supply voltage or VDDQ. The elements for OCD pull-up calibration further include a tristate driver 316 with an output coupled to a data output terminal/pin DQ1 312 and a second input of the comparator 318. The data output terminal/pin DQ1 312 may couple to the output driver of the memory device 252 being calibrated through an external stub resistor $R_{STUB1}$ 351. In other cases, the external stub resistor $R_{STUB1}$ 351 may not be used.

During pull-up calibration, the tristate drivers 314 and 316 are enabled and receive logical zero level inputs to turn on the pull-down transistors to load the terminals/pins 310 and 312. With the pull-up transistor in the driver of the memory device 252 turned on, the comparator 318 is used to compare the voltage levels on the OCD high calibration pin OCDH 310 and the data output terminal/pin DQ1 312 to determine whether or not an adjustment should be made in the drive strength of the pull-up transistor in the memory device 252. If an adjustment is desired, data may be transmitted from the memory controller to the memory device 252 to adjust the drive strength of the pull-up transistor in the memory device 252 from normal and then re-perform the comparison. The data may indicate an increase or decrease in one or more levels of incremental impedance or resistance for the pull-up of the output driver. This cycle may be repeated until a desired setting is reached.

The elements for OCD pull-down calibration by the memory controller 202,202' include the OCD low calibration pin OCDL 320 coupled to one end of an external pull-down resistor $R_{EXTPD}$ 321, an output of a tristate driver 324, and a first input of the comparator 328. The opposite end of the external pull-down resistor $R_{EXTPD}$ 321 is coupled to a second power supply terminal having a negative power supply voltage or ground. The elements for OCD pull-down calibration further include a tristate driver 326 with an output coupled to a data output terminal/pin DQ2 322 and a second input of the comparator 328. The data output terminal/pin DQ2 322 may couple to the output driver of the memory device 252 being calibrated through an external stub resistor $R_{STUB2}$ 352. In other cases, the external stub resistor $R_{STUB2}$ 352 may not be used.

During pull-down calibration, the tristate drivers 324 and 326 are enabled and receive logical one level inputs to turn on the pull-up transistors to load the terminals/pins 320 and 322. With the pull-down transistor in the driver of the memory device 252 turned on, the comparator 328 is used to compare the voltage levels on the OCD low calibration pin OCDL 320 and the data output terminal/pin DQ2 322 to determine whether or not an adjustment should be made in the drive strength of the pull-down transistor in the memory device 252. If an adjustment is desired, data may be transmitted from the memory controller to the memory device 252 to adjust the drive strength of the pull-down transistor in the memory device 252 from normal and then re-perform the comparison. The data may indicate an increase or decrease in one or more levels of incremental impedance or resistance for the pull-down of the output driver. This cycle may be repeated until a desired setting is reached.

The external pull-up resistor $R_{EXTPU}$ 311 may have a resistance value equal to the sum of a pull-up target resistance and the resistance of the external stub resistor $R_{STUB1}$. The external pull-down resistor $R_{EXTPD}$ 321 may have a resistance value equal to the sum of a pull-down target resistance and the resistance of the external stub resistor $R_{STUB2}$. The external stub resistor $R_{STUB1}$ and the external stub resistor $R_{STUB2}$ are external resistors to provide signal integrity. Each data bit DQi has an external stub resistor in the data path between the memory and the memory controller and each is typically of equal resistance. The pull-up target resistance and the pull-down target resistance are typically the same. The pull-up target resistance and the pull-down target resistance may be selected to be eighteen ohms plus or minus three ohms, in the range from 15 to 21 ohms of resistance.

While the OCD high calibration pin OCDH 310 and the OCD low calibration pin OCDL 320 are used for OCD calibration, they may also be used to generate an internal voltage reference (VREF) that is used by input receivers to detect logic levels in digital input signals. That is, the OCDH terminal/pin 310 and OCDL terminal/pin 320 are multifunctional by being used for OCD calibration and for internal voltage reference generation.

Figure 4:
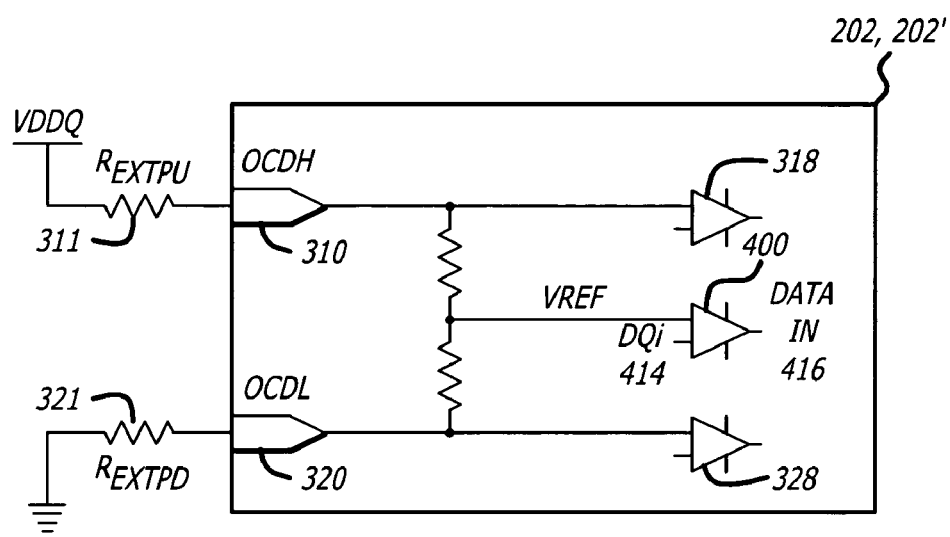
FIG. 4 illustrates a block diagram of the concept of internal voltage reference generation using OCDH and OCDL calibration terminals/pins.

Referring now to FIG. 4, the concept of generating an internal voltage reference (VREF) using the pair of calibration terminals/pins (OCDH 310 and OCDL 320) is illustrated. In this case, the internal voltage reference VREF is generated internally by the voltage divider resistor network established between VDDQ and VSS. Typically the voltage divider resistor network uses two equal value resistances to divide the voltage between VDDQ and VSS in half. When in OCD calibration mode, the pair of calibration terminals/pins (OCDH 310 and OCDL 320) are used to couple the calibration voltage generated thereon to an input of the OCD pull-up comparator 318 and the OCD pull-down comparator 328. When the memory controller is not in OCD calibration mode, (i.e., its in normal mode), the pair of calibration terminals/pins (OCDH 310 and OCDL 320) may be used for generating the internal voltage reference in order to receive data from the memory devices in the memory.

A digital input receiver 400 has one input coupled to a data input terminal/pin DQi 414 and another input coupled to the internal voltage reference (VREF). In response to the voltage level on the data input terminal/pin DQi 414 being above and below the voltage level of the internal voltage reference (VREF), the digital input receiver 400 generates digital logic levels on its output DATA IN 416. For example, if the voltage level on the data input terminal/pin DQi 414 is above the voltage level of the internal voltage reference (VREF), the digital input receiver 400 may generate a high logic level (i.e., a one) on its output DATA IN 416. If the voltage level on the data input terminal/pin DQi 414 is below the voltage level of the internal voltage reference (VREF), the digital input receiver 400 may generate a low logic level (i.e., a zero) on its output DATA IN 416.

At least one pair of switches is used to switch the functionality of the calibration pins between the OCD calibration mode and the normal mode. Embodiments of the invention generate an internal voltage reference VREF by coupling the OCD Low and OCD High terminals/pins (also referred to herein as OCDL 320 and OCDH 310, respectively) together through the pair of switches when the memory controller is not in OCD calibration mode. The pair of switches may have some resistance associated with them when they are in a closed state.

Figure 5A:
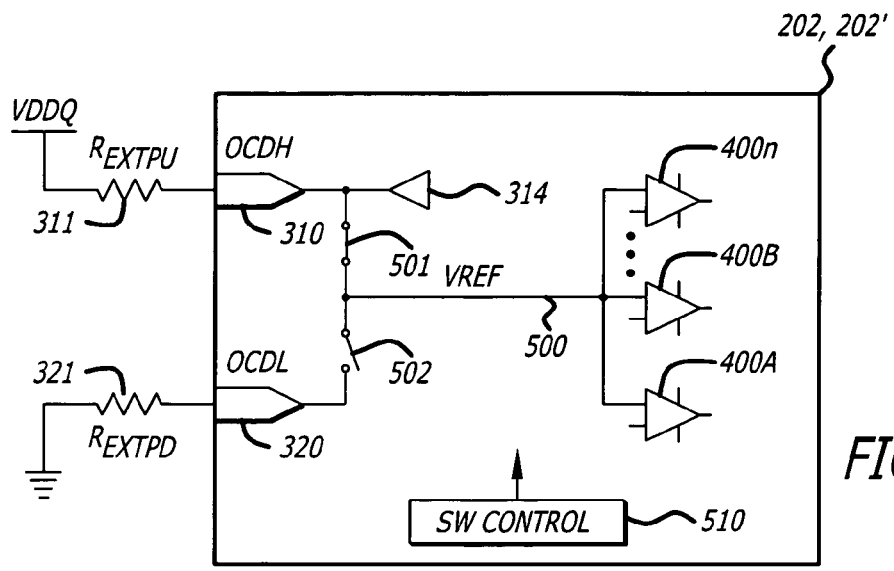
FIG. 5A illustrates a block diagram of the switch settings for generating an OCD pull-up calibration voltage in OCD mode.
Figure 5B:
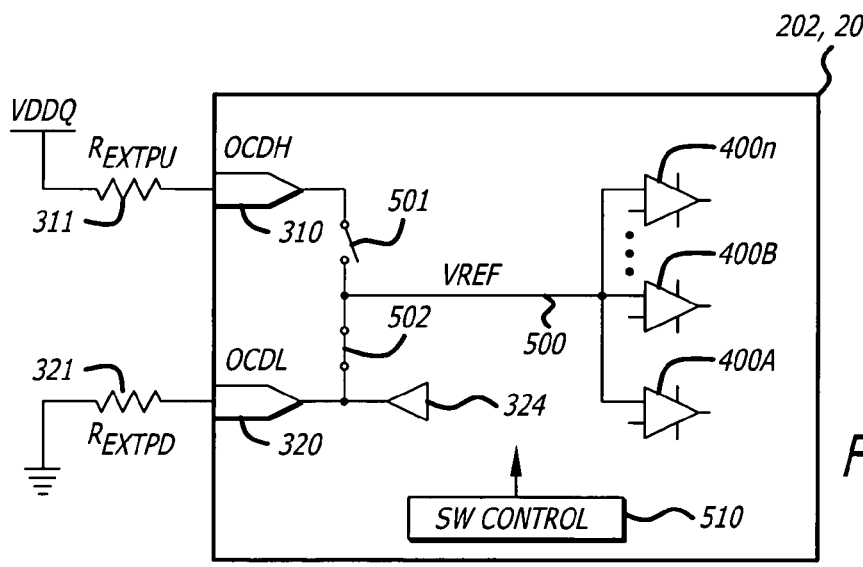
FIG. 5B illustrates a block diagram of the switch settings for generating an OCD pull-down calibration voltage in OCD mode.
Figure 5C:
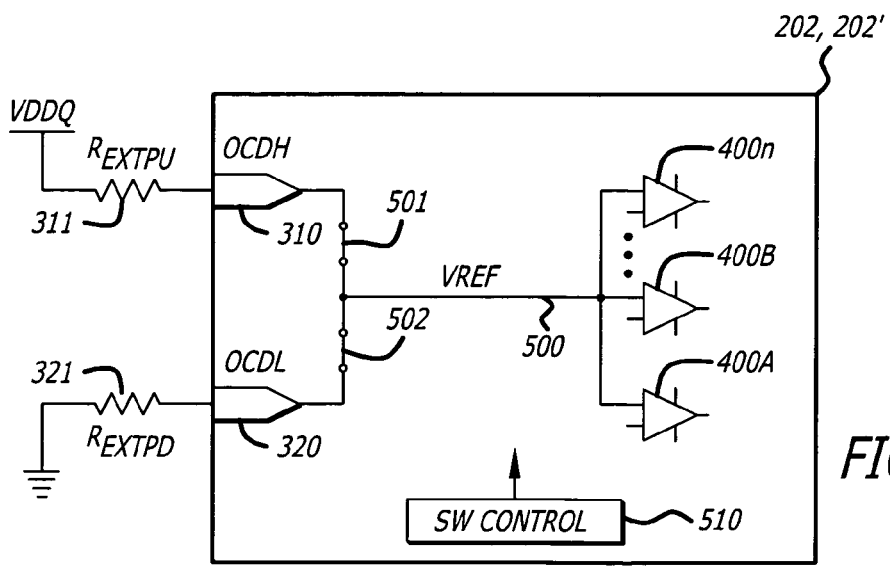
FIG. 5C illustrates a block diagram of the switch settings for internal voltage reference generating for normal mode.

FIGS. 5A–5C illustrate the pair of switches 501,502 in the memory controller 202,202' being switched between the OCD calibration mode (i.e., pull-up and pull-down calibration) and the normal mode when data is to be received. In this configuration of switches in the memory controller, the same node (VREF 500) can be used to distribute a pull-up calibration voltage, a pull-down calibration voltage, and the internal VREF for data reception. In this manner, the number of reference voltages distributed within a semiconductor device may be reduced with the appropriate voltage being selected thereon in response to the mode. Additionally, comparators 318 and 328 dedicated for performing calibration need not be used. Comparators in each input receiver 400A–400n may be used to perform calibration during calibration mode, in addition to receiving data during normal mode.

Each of switches 501, 502 has a first switch connection, a second switch connection, and a control connection. The control connection controls the opening and closing of the switch between the first switch connection and the second switch connection. Switch 501 is coupled between the pull-up calibration terminal OCDH 310 and the voltage reference node 500. The first switch connection of switch 501 is coupled to the pull-up calibration terminal OCDH 310 and second switch connection of switch 501 is coupled to the voltage reference node 500. The control connection of switch 501 is coupled to the switch controller 510. Switch 502 is coupled between the pull-down calibration terminal OCDL 320 and the voltage reference node 500. The first switch connection of switch 502 is coupled to the pull-down calibration terminal OCDL 320 and second switch connection of switch 502 is coupled to the voltage reference node 500. The control connection of switch 502 is coupled to the switch controller 510.

In FIG. 5A, the switches are set to provide OCD pull-up calibration. Switch 501 is closed and switch 502 is open in response to receiving switch control signals from the switch controller 510. The switch controller 510 is responsive to the mode. In this case, the switch controller 510 generates the switch control signals in response to being in an OCD calibration mode to perform OCD pull-up calibration. Note that switch 501 may represent a plurality of switches in parallel with at least one being selectively closed. Switch 502 may represent a plurality of switches in parallel with none being closed in FIG. 5A.

In FIG. 5A, the tristate driver 314 is enabled with a logical zero input to couple a pull-down load onto the OCDH terminal/pin 310. The external resistor $R_{EXTPU}$ 311 is coupled between VDDQ and the OCDH terminal/pin 310 to generate a calibration voltage thereon. The calibration voltage on the OCDH terminal/pin 310 is substantially coupled onto the node VREF 500 through the switch 501 as little current flows through it. The calibration voltage on the OCDH terminal/pin 310 and the node VREF 500 is used by a comparator of the input receivers 400A–400n to compare with a voltage level on a respective data terminal/pin DQi of a data bus, such as described previously with the data terminal/pin DQ1 312.

The data bus of data terminals/pins DQi may be a unidirectional or a bidirectional data bus. In the case of a unidirectional data bus, the data terminals/pins DQi are data input terminals/pins to the memory controller. In the case of a bidirectional data bus, the data terminals/pins DQi are data input/output terminals/pins of the memory controller and have on-chip input receivers and output drivers coupled thereto. The off chip output drivers, that are to be calibrated and from which data is to be received, have their outputs coupled to the respective data terminals/pins DQi.

In FIG. 5B, the switches are set to provide OCD pull-down calibration. Switch 501 is open and switch 502 is closed in response to receiving switch control signals from the switch controller 510. The switch controller 510 generates the switch control signals in response to being in an OCD calibration mode to perform OCD pull-down calibration. Note that switch 501 may represent a plurality of switches in parallel with none closed. Switch 502 may represent a plurality of switches in parallel with at least one being selectively closed in FIG. 5B.

In FIG. 5B, the tristate driver 324 is enabled with a logical one input to couple a pull-up load onto the OCDL terminal/pin 320. The external resistor $R_{EXTPD}$ 321 is coupled between ground and the OCDL terminal/pin 320 to generate a calibration voltage thereon. The calibration voltage on the OCDL terminal/pin 320 is substantially coupled onto the node VREF 500 through the switch 502 as little current flows through it. The calibration voltage on the OCDL terminal/pin 320 and the node VREF 500 is used by a comparator of the input receivers 400A–400n to compare with a voltage level on a data terminal/pin DQi, such as described previously with the data terminal/pin DQ2 322. In this manner, each data terminal/pin DQi may have the pull-up and the pull-down in each off chip driver of the memory device calibrated.

In FIG. 5C, the switches are set to provide the internal VREF for data reception. Switch 501 is closed and switch 502 is closed in response to receiving switch control signals from the switch controller 510. The switch controller 510 generates the switch control signals in response to being in a normal to receive data in from the memories when not driving data out over the data bus. Note that switch 501 may represent a plurality of switches in parallel with at least one being selectively closed. Switch 502 may represent a plurality of switches in parallel with at least one being selectively closed.

In FIG. 5C, the tristate drivers 314 and 324 are disabled (i.e., tristated) so that neither drives a load onto the OCDH terminal/pin 310 or the OCDL terminal/pin 320 and therefore they are not illustrated. The external resistor $R_{EXTPD}$ 321 remains coupled between ground and the OCDL terminal/pin 320 and the external resistor $R_{EXTPU}$ 311 remains coupled between VDDQ and the OCDH terminal/pin 310.

The resistance of the external resistor $R_{EXTPU}$ 311, the switch resistance of switch 501, the switch resistance of switch 502, and the resistance of the external resistor $R_{EXTPD}$ 321, divide up the voltage between VDDQ and ground and couple it to node VREF 500. In one embodiment, the switch point of the input receivers is the midpoint between VDDQ and ground. In this case, it is desirable to set the resistance between VDDQ and VREF 500 equal to the resistance between VREF 500 and ground in order to divide the voltage between VDDQ and ground in half on VREF 500. With the resistance of the external resistor $R_{EXTPU}$ 311 and the resistance of the external resistor $R_{EXTPD}$ 321 being equal, the switch resistances of the switches 501 and 502 are adjusted to be equivalent to divide the voltage between VDDQ and ground in half on VREF 500. In other embodiments, the switch point may be offset from the midpoint between VDDQ and ground by using different switch resistances for the switches 501 and 502.

The internal voltage reference on the node VREF 500 is coupled into one input of the digital input receivers 400. The internal voltage reference on the node VREF 500 is used by the digital input receivers 400 to compare with a voltage level on a data terminal/pin, such as DQi 414, to generate data in 416 as described and illustrated with reference to FIG. 4.

There are multiple ways of instantiating this invention including (but not limited to) using analog switches, pass-gates, or transistors. In one embodiment, a first plurality of field effect transistors ("FETs") with sources connected in parallel together and drains connected in parallel together between OCDH and VREF and a second plurality of field effect transistors ("FETs") with sources connected in parallel together and drains connected in parallel together between VREF and OCDL may be used to generate a selectable voltage level of VREF.

Typically for data reception, (i.e., normal mode), it is desirable to generate VREF at the normal mid-point between power supply rails VDDQ and ground. The number of transistors switched on and off can be varied to substantially achieve the midpoint voltage level. However in some cases it may be desirable to set the voltage level of VREF offset from the midpoint value, such as for testing or experimentation, for example. In the calibration mode, OCD pull-up calibration and OCD pull-down calibration, the voltage level of VREF is respectively set for calibration. During calibration, the current through the field effect transistor ("FET") switches is substantially close to zero such that the voltage drop across them is negligible.

Figure 6:
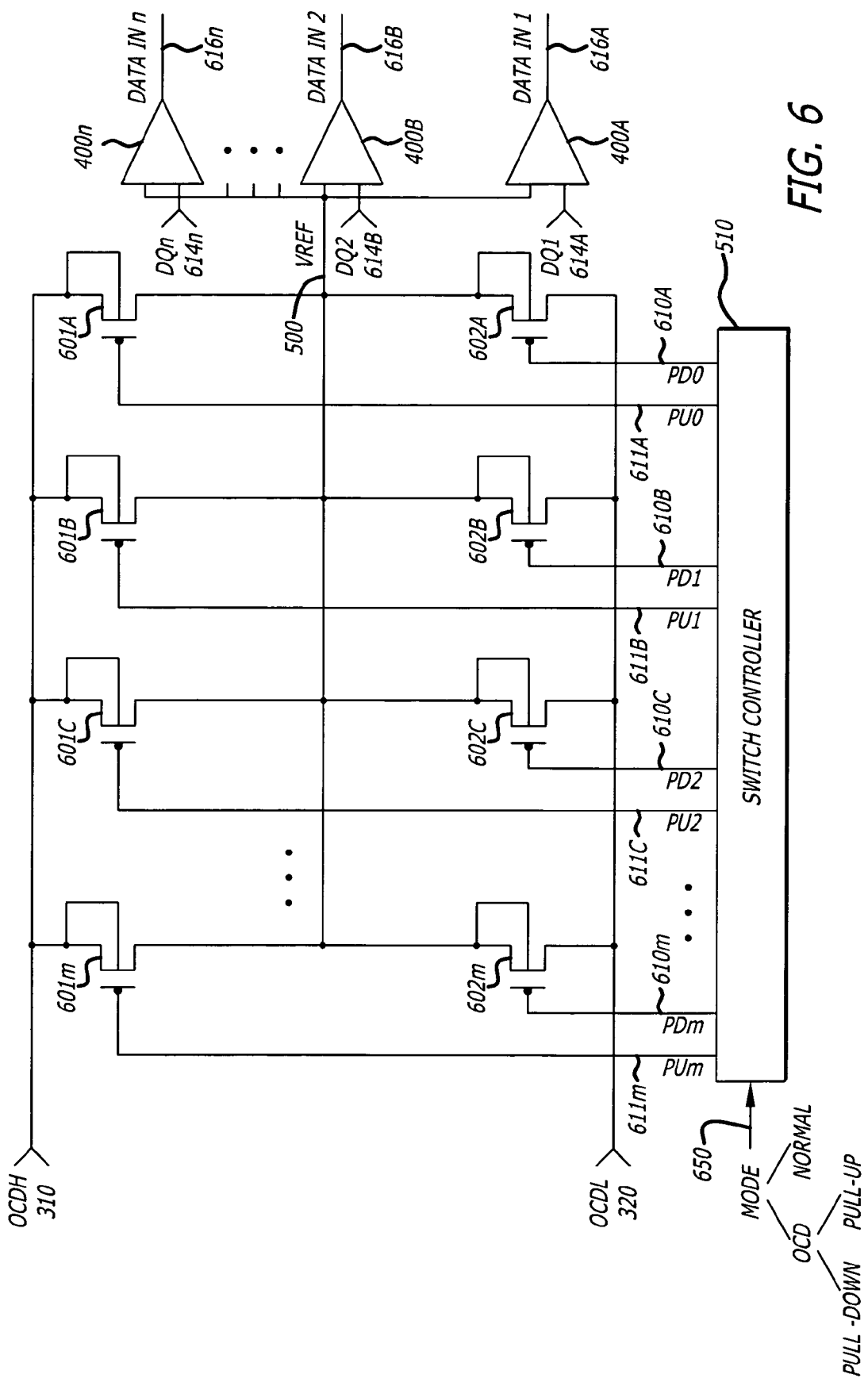
FIG. 6 illustrates an exemplary schematic diagram of transistor switches to provide OCD calibration voltages in OCD mode and an internal voltage reference in a normal mode.

Referring now to FIG. 6, an exemplary schematic diagram of an embodiment of the invention is illustrated. In this embodiment, p-channel field effect transistors ("PFETS") are used between the OCDL terminal/pin 320 and VREF 500 and OCDH terminal/pin 310 and VREF 500. When at least two PFETS between the OCDL and OCDH terminals/pins are both switched ON, the PFETs may be used to generate the internal voltage reference VREF. In yet another embodiment, n-channel field effect transistors ("NFETs") may replace one or both sets of the PFETs. In yet another embodiment, the PFETs may be complemented with NFETs with sources and drains coupled in parallel with those of the PFETs and gates controlled so they are turned on in parallel together. In other embodiments, a different kind of transistor switch or a different type of switch may replace the PFETs.

In FIG. 6, a first plurality of PFETs 601A–601m have their sources connected in parallel together and their drains connected in parallel together between the OCD high calibration terminal/pin OCDH 310 and VREF 500. A second plurality of PFETs 602A–602m have their sources connected in parallel together and their drains connected in parallel together between VREF 500 and the OCD low calibration terminal/pin OCDL 320. The widths and lengths of the first plurality of PFETs 601A–601m may vary from one to another to provide varying switch resistances when closed. The widths and lengths of the second plurality of PFETs 602A–602m may also vary from one to another to provide varying switch resistances when closed.

The PFETs 601A–601m and the PFETs 602A–602m may then be used to generate a selectable voltage level of VREF 500 by selectively controlling the number of transistors turned on in parallel and by controlling the voltage level of the control signals 610A–610m and 611A–611m driving their gates. In this manner the resistance between the OCD high calibration terminal/pin OCDH 310 and VREF 500 may be set equivalent to the resistance between VREF 500 and the OCD low calibration terminal/pin OCDL 320 to provide voltage division by one half.

The switch controller 510 is responsive to a mode input 650 in generation of the switch control signals PD0–PDm 610A–610m and the switch control signals PU0–PUm 611A–611m. If the mode input 650 is normal, the internal voltage reference is generated on node VREF 500 by at least one pair of switches, one PFET of PFETs 601A–601m is turned on and one PFET of PFETs 602A–602m is turned on. If the mode input 650 is OCD pull-up calibration, the pull-up calibration voltage is coupled into the node VREF 500 and at least one or more PFETs of the PFETs 601A–601m is turned on and none of PFETs 602A–602m is turned on (i.e. PFETs 602A–602m are all off). If the mode input 650 is OCD pull-down calibration, the pull-down calibration voltage is coupled into the node VREF 500 and at least one or more PFETs of the PFETs 602A–602m is turned on and none of PFETs 601A–601m is turned on (i.e. PFETs 601A–601m are all off).

VREF 500 is fanned out and coupled into an input of each digital input receiver 400A–400n. The data terminals/pins DQ1–DQn 614A–614n are respectively coupled into the other input of each digital input receiver 400A–400n. When in calibration mode, the calibration voltages selectively coupled from the OCDH terminal/pin 310 and the OCDL terminal/pin 320 onto the node VREF 500 are used by a comparator of the input receivers 400A–400n to compare with a voltage level on the data terminals/pins DQ1–DQn 614A–614n.

The data bus of data terminals/pins DQ1–DQn 614A–614n may be a unidirectional or a bidirectional data bus. In the case of a unidirectional data bus, the data terminals/pins DQ1–DQn 614A–614n are data input terminals/pins. In the case of a bidirectional data bus, the data terminals/pins DQ1–DQn 614A–614n are data input/output terminals/pins of the memory controller and have on-chip input receivers and output drivers coupled thereto. The off chip output drivers, that are to be calibrated and from which data is to be received, have their outputs coupled to the respective data terminals/pins DQ1–DQn 614A–614n.

Each data terminal/pin DQ1–DQn 614A–614n may have the pull-up and the pull-down in each off chip driver of the memory device calibrated. When in normal mode, the reference voltage selectively coupled onto the node VREF 500 is used by a comparator of the input receivers 400A–400n to compare with a voltage level on the data terminals/pins DQ1–DQn 614A–614n to determine the logical state of incoming signals.

Typically for data reception, it is desirable to generate VREF at the normal mid-point between power supply rails VDDQ and ground. The number of transistor switched on and off can be varied by the switch controller 510 to substantially achieve the midpoint voltage level. However in some cases it may be desirable to set the voltage level of VREF offset from the midpoint value, such as for testing or experimentation, for example.

When operated in normal mode, an equal strength of FETs may be connected to OCD Low and OCD High pins. Even though the on-resistance of the FETS may vary with process, voltage, and temperature; it is possible to match the FETs so that the resistance from VREF 500 to the OCDH terminal/pin 310 is equal to the resistance from VREF 500 to the OCDL terminal/pin 320 to get an accurate mid-point VREF. The switch controller 510 may also generate various voltage levels of the switch control signals PD0–PDm 610A–610m and the switch control signals PU0–PUm 611A–611m to vary gate voltage applied to the gates of the PFETs 601A–601m and the PFETs 602A–602m in order to vary their resistance so that they may be more equivalent or less equivalent as desired.

In the calibration mode, OCD pull-up calibration and OCD pull-down calibration, the voltage level on node VREF 500 is respectively set for calibration as discussed previously. During calibration, the current through the field effect transistor ("FET") switches is substantially close to zero such that the voltage drop across them is negligible.

Figure 7:
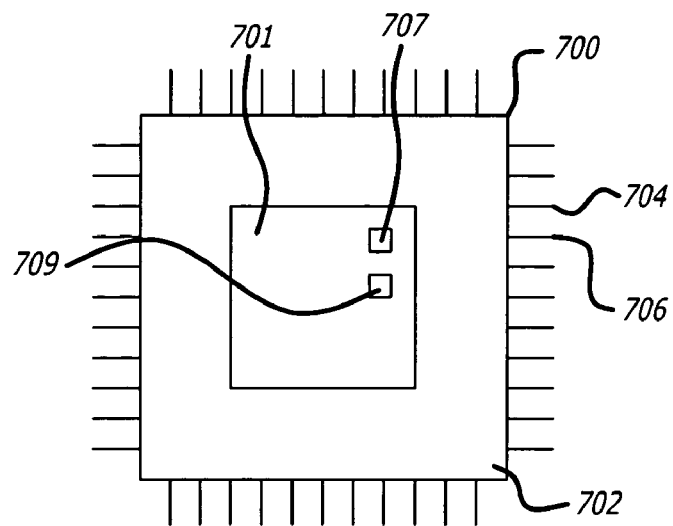
FIG. 7 illustrates a block diagram of a packaged integrated circuit without an external voltage reference terminal/pin.

Referring now to FIG. 7, a packaged integrated circuit 700 is illustrated. The packaged integrated circuit 700 may be a memory controller 202, a processor 201' including a memory controller 202', or another device with a DDR memory interface. The packaged integrated circuit 700 includes a semiconductor die 701 and a package 702. The package 702 includes an OCDH terminal/pin 704 and an OCDL terminal/pin 706 and no external VREF terminal/pin. The OCDH terminal/pin 704 and the OCDL terminal/pin 706 may be pins or other types of terminals of different semiconductor packages, such as solder bumps, solder balls, or the various types of leaded terminals (e.g., straight-lead, bent-lead, j-lead, gull-lead, and l-lead) and leadless terminals used in semiconductor packages. The OCDH terminal/pin 704 and an OCDL terminal/pin 706 selectively provide multiple functions—OCD calibration and internal VREF generation. The semiconductor die 701 includes an OCDH pad 707 and an OCDL pad 709 with no extra VREF pad to connect to an external VREF terminal/pin.

The embodiments of the invention may reduce the number of printed circuit board components (e.g., no external resistors for voltage divider) and the number of pins in the pin-out (or balls in a ball-out of a ball grid array package) of memory controllers. The embodiments of the invention can internally generate a voltage reference, eliminating the external VREF pin/terminal, without a loss of accuracy or the use of complex analog circuits.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, while a DDR memory interface has been described in detail within a DDR memory controller, it is possible to implement embodiments of the invention in other types of chips having a similar type of interface.

What is claimed is:

1. An integrated circuit to interface to memory, the integrated circuit comprising:
    a first off chip driver calibration terminal to couple to an external pull-up resistor;
    a first tristate driver having an output coupled to the first off chip driver calibration terminal for pull-up calibration of pull-up transistors;
    a second off chip driver calibration terminal to couple to an external pull-down resistor;
    a second tristate driver having an output coupled to the second off chip driver calibration terminal for pull-down calibration of pull-down transistors;
    a first switch coupled between the first off chip driver calibration terminal and a voltage reference node; and
    a second switch coupled between the second off chip driver calibration terminal and the voltage reference node.

2. The integrated circuit of claim 1, wherein
    the first switch is selectively closed and the second switch is selectively opened to generate a pull-up calibration voltage on the voltage reference node to calibrate an off-chip driver.

3. The integrated circuit of claim 2, wherein
    the first switch is selectively opened and the second switch is selectively closed to generate a pull-down calibration voltage on the voltage reference node to further calibrate the offchip driver.

4. The integrated circuit of claim 1, wherein
    the integrated circuit is a memory controller.

5. The integrated circuit of claim 1, wherein
    the integrated circuit is a processor.

6. The integrated circuit of claim 1, wherein
    the first switch and the second switch are selectively closed to generate an internal voltage reference on the voltrage reference node with which an input signal is compared in order to receive data.

7. An integrated circuit to interface to memory, the integrated circuit comprising:
    a first off chip driver calibration terminal to couple to an external pull-up resistor;
    a second off chip driver calibration terminal to couple to an external pull-down resistor;
    a first switch coupled between the first off chip driver calibration terminal and a voltage reference node;
    a second switch coupled between the second off chip driver calibration terminal and the voltage reference node; and
    a plurality of input receivers each having a first input coupled to the voltage reference node and a second input coupled to a respective data terminal of a plurality of data terminals.

8. The integrated circuit of claim 7, wherein
    each input receiver includes
    a comparator having a first input coupled to the voltage reference node and a second input coupled to the respective data terminal, the data terminal to couple to an off-chip output driver for calibration.

9. The integrated circuit of claim 7, further comprising:
a switch controller having a mode input, a first control output coupled to a control input of the first switch, and a second control output coupled to a control input of the second switch, the switch controller to control the opening and closing of the first switch and the second switch in response to the mode input.

10. The integrated circuit of claim 9, wherein
the first switch and the second switch are selectively closed to generate an internal voltage reference on the voltage reference node with which an input signal is compared in order to receive data;
the first switch is selectively closed and the second switch is selectively opened to generate a pull-up calibration voltage on the voltage reference node to calibrate an off-chip driver; and
the first switch is selectively opened and the second switch is selectively closed to generate a pull-down calibration voltage on the voltage reference node to further calibrate the off-chip driver.

11. An integrated circuit to interface to memory, the integrated circuit comprising:
a first off chip driver calibration terminal to couple to an external pull-up resistor;
a first tristate driver having an output coupled to the first off chip driver calibration terminal for pull-up calibration of pull-up transistors;
a second off chip driver calibration terminal to couple to an external pull-down resistor;
a second tristate driver having an output coupled to the second off chip driver calibration terminal for pull-down calibration of pull-down transistors;
a first switch coupled between the first off chip driver calibration terminal and a voltage reference node;
a second switch coupled between the second off chip driver calibration terminal and the voltage reference node; and
a switch controller having a mode input, a first control output coupled to a control input of the first switch, and a second control output coupled to a control input of the second switch, the switch controller to control the opening and closing of the first switch and the second switch in response to the mode input.

12. The integrated circuit of claim 11, wherein
the first switch and the second switch are selectively closed to generate an internal voltage reference on the voltage reference node with which an input signal is compared in order to receive data;
the first switch is selectively closed and the second switch is selectively opened to generate a pull-up calibration voltage on the voltage reference node to calibrate an off-chip driver; and
the first switch is selectively opened and the second switch is selectively closed to generate a pull-down calibration voltage on the voltage reference node to further calibrate the off-chip driver.

13. The integrated circuit of claim 11, wherein
the first switch and the second switch are selectively closed to generate an internal voltage reference on the voltage reference node with which an input signal is compared in order to receive data.

14. The integrated circuit of claim 11, wherein
the first switch is selectively closed and the second switch is selectively opened to generate a pull-up calibration voltage on the voltage reference node to calibrate an off-chip driver.

15. The integrated circuit of claim 11, wherein
the first switch is selectively opened and the second switch is selectively closed to generate a pull-down calibration voltage on the voltage reference node to calibrate an off-chip driver.

16. A method in an integrated circuit for interfacing to a memory, the method comprising:
if in an off-chip driver calibration mode for a pull-up, then
selecting a pull-up calibration terminal to be coupled to a voltage reference node to provide a pull-up calibration voltage thereon, and
calibrating a pull-up of an off chip driver;
if in an off-chip driver calibration mode for a pull-down, then
selecting a pull-down calibration terminal to be coupled to the voltage reference node to provide a pull-down calibration voltage thereon, and
calibrating a pull-down of the off chip driver; and,
if in a normal mode to receive data, then
selecting the pull-up calibration terminal and the pull-down calibration terminal to be coupled to the voltage reference node to provide a reference voltage thereon, and
receiving data from a data terminal.

17. The method of claim 16 further comprising:
prior to selecting, calibrating and receiving, coupling an external pull-up resistor to the
pull-up calibration terminal; and coupling an external pull-down resistor to the pulldown calibration terminal.

18. The method of claim 16, wherein
the receiving data from the data terminal includes
comparing the reference voltage on the voltage reference node with an incoming signal on the data terminal.

19. The method of claim 18, wherein
the calibrating of the pull-up of the off chip driver includes
comparing the pull-up calibration voltage on the voltage reference node with an incoming signal on the data terminal.

20. The method of claim 19, wherein
the calibrating of the pull-down of the off chip driver includes
comparing the pull-down calibration voltage on the voltage reference node with an incoming signal on the data terminal.

21. A system comprising:
a processor for executing instructions and processing data;
a double data rate memory device to store data from the processor and to read data to the processor;
an external pull-up resistor having a first end coupled to a first power supply terminal;
an external pull-down resistor having a first end coupled to a second power supply terminal; and
a memory controller coupled between the double data rate memory device and the processor, the memory controller including
a pull-up calibration terminal coupled to a second end of the external pullup resistor, a first tristate driver having an output coupled to the pull-up calibration terminal for pull-up calibration of pull-up transistors in the double data rate memory device, a pull-down calibration terminal coupled to a second end of the external pull-down resistor, a second tristate driver having an output coupled to the pull-down calibration terminal for pull-down calibration of pull-down transistors in the double data rate memory device, a voltage reference node, a first switch having a first switch connection coupled to the pull-up calibration terminal and a second switch connection coupled to the voltage reference node, and a second switch having a first switch connection coupledto the pull-down calibration terminal and a second switch connection coupled to the voltage reference node.

22. The system of claim 21, wherein the memory controller is an integrated circuit separate from the processor.

23. The system of claim 21, wherein the processor is an integrated circuit and includes the memory controller.

24. The system of claim 21, wherein the memory controller further includes a switch controller having a mode input, a first control output coupled to a control input of the first switch, and a second control output coupled to a control input of the second switch, the switch controller to control the opening and closing of the first switch and the second switch in response to the mode input.

25. The system of claim 24, wherein the first switch and the second switch are selectively closed to generate an internal voltage reference on the voltage reference node with which an input signal is compared in order to receive data;

the first switch is selectively closed and the second switch is selectively opened to generate a pull-up calibration voltage on the voltage reference node to calibrate a driver of the DDR memory device; and the first switch is selectively opened and the second switch is selectively closed to generate a pull-down down calibration voltage on the voltage reference node to further calibrate the driver of the DDR memory device.

26. A processor for a computer system, the processor including:

a memory controller to interfade to memory, the memory controller having a pull-up calibration terminal to couple to an external pull-up resistor, a first tristate driver having an output coupled to the pull-up calibration terminal for pull-up calibration of pull-up transistors in the double data rate memory device, a pull-down calibration terminal to couple to an external pull-down resistor, a second tristate driver having an output coupled to the pull-down calibration terminal for pull-down calibration of pull-down transistors in the double data rate memory device, a voltage reference node, a first switch coupled between the pull-up calibration terminal and the voltage reference node, a second switch coupled between the pull-down calibration terminal and the voltage reference node, and a switch controller having a mode input, a first control output coupled to a control input of the first switch, and a second control output coupled to a control input of the second switch, the switch controller to control the opening and closing of the first switch and the second switch in response to the mode input.

27. The processor of claim 26, wherein the first switch and the second switch are selectively closed to generate an internal voltage reference on the voltage reference node with which an input signal is compared in order to receive data from a driver of a memory device;

the first switch is selectively closed and the second switch is selectively opened to generate a pull-up calibration voltage on the voltage reference node to calibrate the driver of the memory device; and the first switch is selectively opened and the second switch is selectively closed to generate a pull-down calibration voltage on the voltage reference node to further calibrate the driver of the memory device.

28. The processor of claim 27, wherein the memory device is a double data rate (DDR) memory device.

29. A packaged integrated circuit to interface to memory, the packaged integrated circuit comprising:

a first off-chip driver calibration terminal to couple to a first external resistor;

a second off-chip driver calibration terminal to couple to a second external resistor;

a first plurality of field effect transistors having sources coupled in parallel together to the first off-chip driver calibration terminal and drains coupled in parallel together to a voltage reference node; and a second plurality of field effect transistors having drains coupled in parallel together to the second off-chip driver calibration terminal and sources coupled in parallel together to the voltage reference node.

30. The packaged integrated circuit of claim 29 wherein the first plurality of field effect transistors and the second plurality of field effect transistors are p-channel field effect transistors.

31. The packaged integrated circuit of claim 29 wherein the first plurality of field effect transistors and the second plurality of field effect transistors are n-channel field effect transistors.

32. The packaged integrated circuit of claim 29 wherein the first plurality of field effect transistors are p-channel field effect transistors, and the second plurality of field effect transistors are n-channel field effect transistors.

33. The packaged integrated circuit of claim 29 wherein the first plurality of field effect transistors are n-channel field effect transistors, and the second plurality of field effect transistors are p-channel field effect transistors.

34. The packaged integrated circuit of claim 29 wherein the first plurality of field effect transistors are p-channel field effect transistors and n-channel field effect transistors having sources coupled in parallel together and drains coupled in parallel together, and the second plurality of field effect transistors are p-channel field effect transistors and n-channel field effect transistors having sources coupled in parallel together and drains coupled in parallel together.

35. The packaged integrated circuit of claim 29 further comprising:
a switch controller having a mode input, a first plurality of switch control signals coupled to respective gates of the first plurality of field effect transistors, a second plurality of switch control signals coupled to respective gates of the second plurality of field effect transistors, the switch controller to control the switching of the first and second plurality of field effect transistors.

36. The packaged integrated circuit of claim 29 further comprising:
a plurality of input receivers each having a first input coupled to the voltage reference node and a second input coupled to respective data terminals to receive data.

37. The packaged integrated circuit of claim 36, wherein each input receiver includes
a comparator having a first input coupled to the voltage reference node and a second input coupled to a respective data terminal to calibrate a pull-up and a pull-down of an off-chip output driver.

38. The packaged integrated circuit of claim 37, wherein the comparator of each input receiver further to receive data by comparing a reference voltage on the reference node with an input signal on the respective data terminal.

* * * * *